(12) United States Patent
McCollough, Jr. et al.

(10) Patent No.: US 9,551,761 B2
(45) Date of Patent: Jan. 24, 2017

(54) PORTABLE MAGNETIC, ELECTRIC AND RADIO FREQUENCY FIELD MONITORING APPARATUS AND METHOD

(71) Applicant: Electric Power Research Institute, Palo Alto, CA (US)

(72) Inventors: Norman Darnell McCollough, Jr., Melbourne, FL (US); Philip Cochrane, Maryville, TN (US); Robert Ira Kavet, Oakland, CA (US)

(73) Assignee: ELECTRIC POWER RESEARCH INSTITUTE, Palo Alto, CA (US)

( * ) Notice: Subject to any disclaimer, the term of this patent is extended or adjusted under 35 U.S.C. 154(b) by 572 days.

(21) Appl. No.: 14/102,199

(22) Filed: Dec. 10, 2013

(65) Prior Publication Data

US 2014/0159716 A1    Jun. 12, 2014

Related U.S. Application Data

(60) Provisional application No. 61/735,158, filed on Dec. 10, 2012.

(51) Int. Cl.
| | |
|---|---|
| G01N 27/82 | (2006.01) |
| G01R 33/00 | (2006.01) |
| G01R 33/02 | (2006.01) |
| G01R 33/028 | (2006.01) |

(52) U.S. Cl.
CPC ....... *G01R 33/0005* (2013.01); *G01R 33/0206* (2013.01); *G01R 33/028* (2013.01)

(58) Field of Classification Search
CPC ..... G01S 19/34; G01R 33/028; G01R 33/288; G01N 29/2443; G01N 27/9033; G01N 33/0031; H01Q 1/246; G01L 1/2256
USPC .... 324/236–247, 200, 207.2, 213, 225, 301, 324/331, 345, 529, 750.12, 750.21, 324/754.17, 754.29
See application file for complete search history.

(56) References Cited

U.S. PATENT DOCUMENTS

| | | | |
|---|---|---|---|
| 8,456,160 B2* | 6/2013 | Cantave | G01R 33/0035 324/202 |
| 2014/0055151 A1* | 2/2014 | Nguyen | G01R 15/146 324/714 |

* cited by examiner

*Primary Examiner* — Melissa Koval
*Assistant Examiner* — Trung Nguyen
(74) *Attorney, Agent, or Firm* — Dergosits & Noah LLP (57) ABSTRACT

The use of implanted medical devices that address a wide range of health conditions is rapidly expanding. These implanted devices include: Cochlear implants, drug dispensing pumps, cardiac pacemakers, defibrillators and other devices. Although these devices are designed to withstand interference from external radio frequency, electric and magnetic fields, interference can occur which may affect the operation of these devices and pose a health risk. An inventive personal, body-wearable electric field, radio frequency, and three-axis magnetic field monitoring device detects the ambient radio frequency, electric and magnetic fields and warns the wearer when any of these field measurements exceeds a safe level.

23 Claims, 5 Drawing Sheets

PORTABLE MAGNETIC, ELECTRIC AND RADIO FREQUENCY FIELD MONITORING APPARATUS AND METHOD

FIELD OF INVENTION

The present invention is directed towards a personal, body-wearable, three-axis magnetic field, electric field and radio frequency field monitor device with hazard level alarm and detection method therein useful as a high field level warning apparatus for those individuals with implanted medical devices.

BACKGROUND

The use of implanted medical devices that address a wide range of health conditions is rapidly expanding. Cardiac pacemakers and defibrillators are probably the most widely used devices, allowing many men and women to return to productive working lives. Other implanted devices can include cochlear ear implanted device, medicinal pump implanted device, and electrically operated mechanical limb prostheses.

Although these devices are designed to withstand interference from external electromagnetic fields from across the non-ionizing spectrum, various studies have indicated that the probability that electronic interference that can affect the operation of these devices can occur cannot be assumed to be zero. Some devices are available to warn users with implanted medical devices, but none offer a comprehensive suite of these field sensors for monitoring environmental conditions. What is needed is an improved monitor device that can detect the presence of magnetic fields, electric fields and radio frequency fields and provide a warning when any of these fields exceeds a predetermined value.

SUMMARY OF THE INVENTION

The present invention is directed towards a personal monitor that informs a person who has an implanted medical device such as a cardiac pacemaker or defibrillator that an electric, radio frequency and/or magnetic field in his or her ambient environment is approaching or above levels that could conceivably interfere with the implant's proper performance. The personal monitor device can be programmed or set to specific threshold values for electric, radio frequency and/or magnetic fields. These threshold values that can affect performance can depend upon the implanted device. When the personal monitor detects an electric, radio frequency or magnetic field that exceeds any of the predetermined values, the personal monitor can actuate an alarm mechanism which can provide audible, visual, and/or vibration signals to alert the wearer.

The personal monitor can include magnetic field sensors, a radio frequency sensor and an electrical field sensor. These sensors can be coupled to a processor and an output device. The magnetic field sensor can be used to detect magnetic fields in x, y and z axes. Because magnetic fields are directional, it can be important to for the magnetic sensors to be aligned in three axes to properly detect ambient magnetic fields. The personal monitor can also include a radio frequency sensor that detects radio frequency fields at specific frequency bands that may interfere with implanted devices. Because these RF frequencies that need to be monitored are implanted device specific, the personal monitoring device can be programmed with the specific operating frequencies of the implant device(s). Because other frequencies, do may not interfere with the device, the personal monitor does not detect all ambient radio frequencies.

The personal monitor described herein can simultaneously monitor and compare magnetic field levels in the x, y and z axes, omni-directional electric fields, and specific frequency band RF fields to corresponding threshold alarm values for each of these fields. The individually monitored magnetic, electric and RF fields have threshold alarm-set levels that are separately programmable magnetic field limits for: electric field limits, and RF field limits. In an embodiment the electric field threshold alarm set level is about 1,000 volts/meter and the magnetic field threshold alarm set level is about 1 Gauss. The threshold alarm set level for the RF field can depend upon the operating frequency of the implanted medical device. In other embodiments, the monitoring device can provide lower level warning based upon lower detected electrical, RF and magnetic field levels.

The invention described herein is directed towards a personal monitor method and apparatus having multi-field detection capabilities. The inventive personal monitor field detection can include: 3-axis magnetic fields, electric fields, and RF fields. The personal monitor can compare the detected fields to predetermined threshold levels for magnetic, RF and electric fields. The personal monitor invention also includes method for comparing the ambient field levels to predetermined levels and actuating an alarm mechanism to warn the implant patient of a potentially hazardous environment.

DETAILED DESCRIPTION

Figure 1:
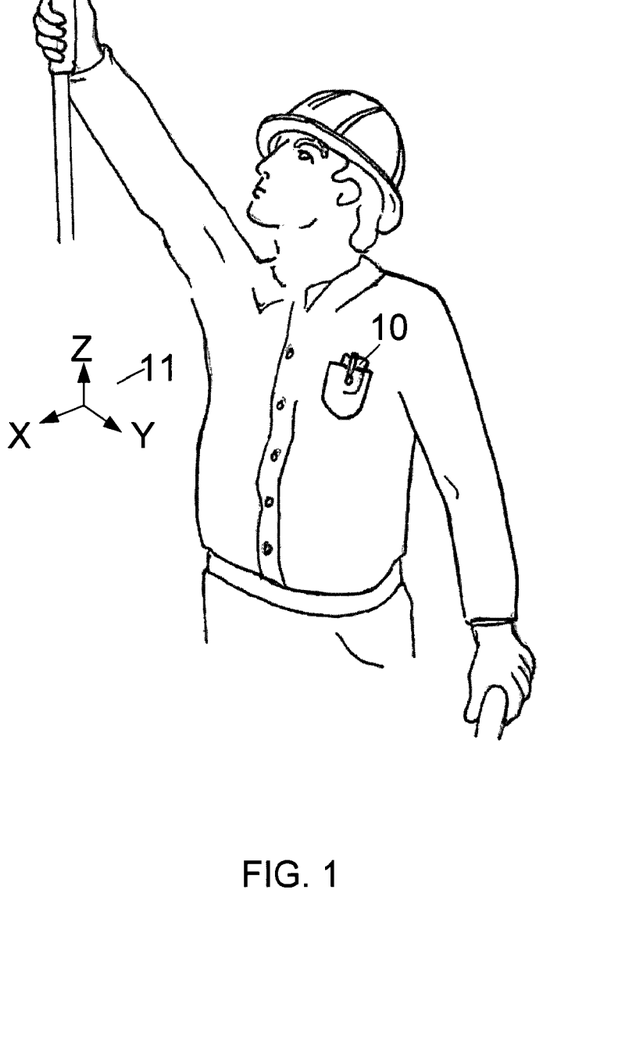
FIG. 1 is a depiction of the inventive device, 100, a personal magnetic field; electric field and radio frequency field monitor device placed in a shirt pocket of a person.

Referring to FIG. 1, the depicted worker is wearing the inventive device 10 at an example position inside a shirt pocket. The example position for whole body protection is in the shirt pocket. The magnetic fields axes reference 11 is also depicted as a reference for the x, y, and z planes of sensitivity of the inventive device. In other embodiments, the inventive device could also be located on the hard hat, a belt-attached device placed at the waist of the person, or at another position at the discretion of the user. Although, the x, y and z axis are illustrated with the z axis as the vertical axis, this is merely an example of a possible orientation. In other embodiments, the x, y and z axis 11 can be in any orientation or directions.

Figure 2:
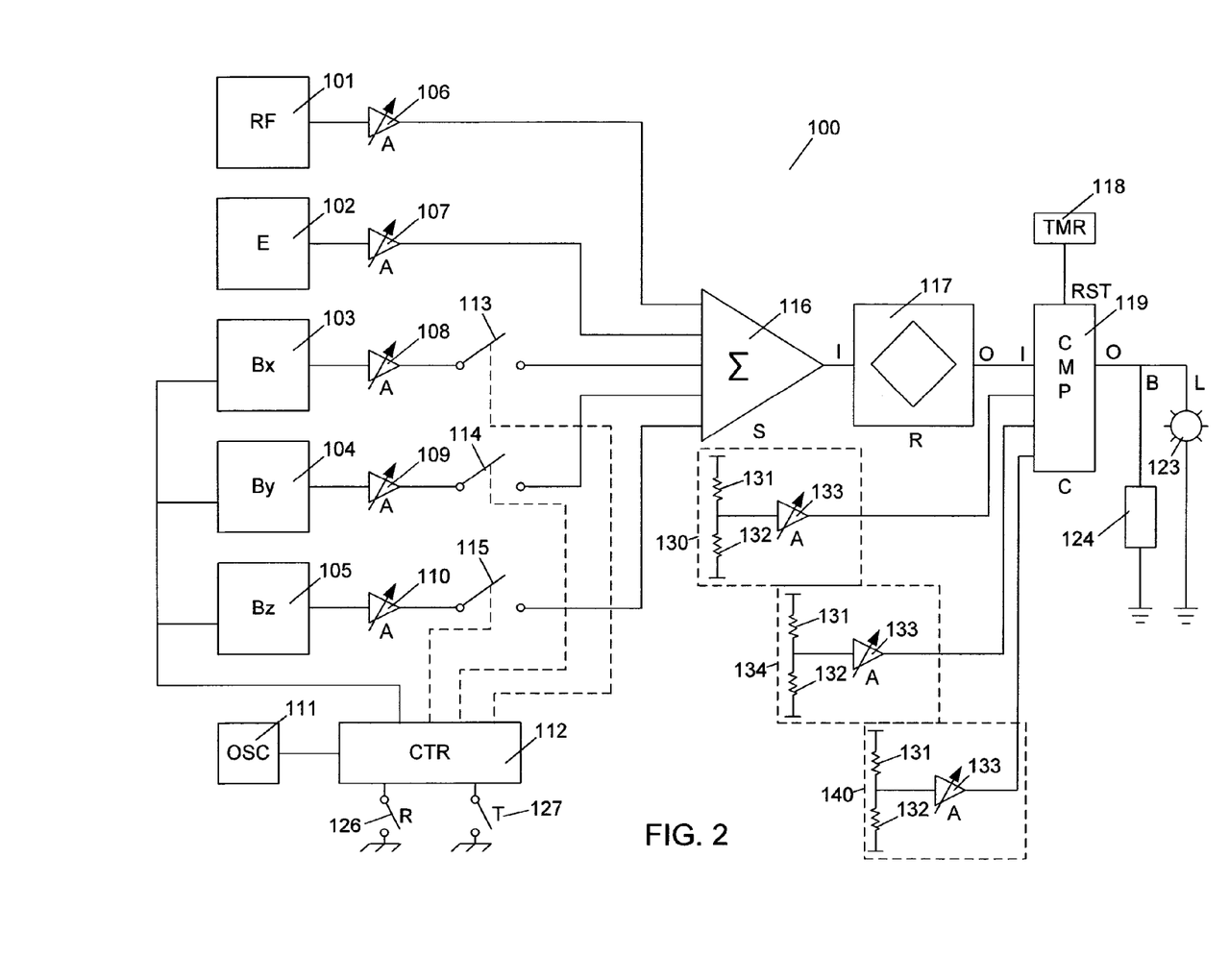
FIG. 2 is the block diagram of the circuitry of the inventive device.

With reference to FIG. 2, a block diagram of an embodiment of the personal monitoring device 100 is illustrated. The monitoring device 100 can include various sensor elements including: a radio frequency (RF) field sensor RF 101, an electric field sensor E 102, and a plurality of magnetic field sensors 103, 104 and 105. Some or all of these sensors can be present in the monitoring device 100 and each sensor form an input element for comparing various sensed environmental fields present proximate to the monitoring device 100. In an embodiment, the magnetic field sensors 103, 104 and 105 are low power MEMS magnetometer devices. In other embodiments, any other type of suitable magnetic field sensor can be used. The illustrated components can be powered by a battery which can be a rechargeable battery and the components can be mounted within a protective housing.

Each of the magnetic field sensors can be orthogonal and aligned with an x, y and z axis. For example, magnetic sensor Bx 103 can be aligned the x axis, magnetic sensor By 104 can be aligned with the y direction and magnetic sensor Bz 105, can be aligned with the z direction. This configuration of magnetic field sensors can be important in providing the personal monitor the ability to detect all magnetic fields. Because magnetic fields are directional, a magnetic field sensor may not be able to detect a magnetic field unless the sensor is aligned with the magnetic field. By positioning the magnetic sensors in the described manner, the magnetic sensors will be able to detect a strong magnetic field regardless of the position or orientation of the personal monitoring device 100.

The output signals from the electrical, RF and magnetic field sensors can be processed so that the sensors measurements can be compared to predetermined threshold values by the personal monitor to determine if any threshold values have been exceeded. The sensors 101-105 can produce small current output signals or other output signals. In order to process these signals, the outputs of the sensors 101-105 can each be coupled to a signal conditioning circuitry element "A" 106-110. The signal conditioning circuitry 106-110 can amplify and condition the received field signals so that the sensor output signals can be processed by the personal monitor 100. Each signal conditioning element A 106-110 can have a programmable variable gain to allow individually setting field levels to compare to warning limit levels. In an embodiment, the signal conditioning circuitry 106-110 can convert the sensor output signals into an appropriate output. The outputs can be different for each type of sensor. For example, the RF field and electrical field sensors may have a direct current (DC) output and the magnetic field sensors may have an alternating current (AC) output. These output signals can be amplified and conditioned by the signal conditioning elements A 106-110.

The personal monitor 100 can include a low frequency oscillator circuitry 111 and a binary counter selector 112. In an embodiment, electrical power can be selectively applied to the magnetic field sensors 103, 104 and 105 and the outputs of the magnetic field sensors 103, 104 and 105 can be individually switched on/off with switches 113, 114 and 115 respectively by the binary counter selector 112. The power can be applied to the magnetic field sensors 103, 104 and 105 and the switches 113, 114 and 115 can be actuated sequentially to scan the ambient magnetic fields oriented in the x, y, and z axes respective to the device. Scanning the magnetic field sensors 103, 104 and 105 individually in each of the three axes allows power switching the magnetometers to lower the inventive device overall current requirements in a preferred embodiment. In an embodiment, the first magnetic field sensor, the second magnetic field sensor and the third magnetic field sensor are selected and compared to the threshold value at least 2 times each second. By switching the magnetic field sensors, the energy efficiency of the personal monitor is improved. In other embodiments, the magnetic field sensors can all be and readings from each of these sensors can be monitored simultaneously.

The low frequency oscillator circuitry 111 and the binary counter selector 112 can also provide the power switching logic and magnetometer reset logic to further allow self-calibration and self-test functions of the magnetic elements 103, 104, and 105. In a preferred embodiment, the zero count of the counter selector 112 has a reset switch R 126, and a test circuitry switch T 127. When the reset switch R 126 is actuated, a reset current can be applied to all the magnetometers simultaneously to provide a magnetic field to each sensor. The magnetic fields can be sufficient to reset any residual magnetic fields in the magnetic sensing elements themselves resulting in more accurate magnetic field readings. When the test circuitry switch T 27 is actuated, the binary counter selector 112 provides a current to the magnetometers 103-105 representing a preset alarm level sufficient to set a temporary alarm condition in the personal monitor 100. This test function is useful as a self-test of the inventive personal monitor 100.

The electric, radio frequency, and magnetometer signal conditioning circuitry 106-110 are connected to the summing circuitry S 116 which forwards the sensor signals to a rectifier 117 and a comparator 119. The summing circuitry S 116 can forward the magnetic field output signal that is turned on and forwarded the electric field and RF field signals to the input of rectifier circuitry R 117 which converts the conditioned sensor signals into analog DC signals. If the input signal is an AC signal, the rectifier circuitry R 117 can convert this signal into a DC level output signal. If the input signal is a DC signal, the rectifier circuitry 117 can output this signal as a DC level output voltage to the comparator circuitry CMP 119.

The time varying DC level from the output of the rectifier circuitry can be compared to a reference level from one of the reference circuits 130, 134, 140. Because each of the electrical, RF and magnetic field measurements can have a different alarm threshold value, the comparator circuitry CMP 119 can coordinate the sensor signals from the rectifier 117 with the corresponding reference level programmed into the reference circuits 130, 134, 140. Each of the reference circuits 130, 134, 140 can comprise level setting resistors 131 and 132 and a programmable level set by gain circuitry A 133. The level setting resistors 131 and 132 can be digital potentiometers that can be adjusted and set manually or through an electrical mechanism having a user interface. In an embodiment, the reference circuit 130 can be used to set an RF field threshold alarm value, reference circuit 134 can be used to set an electric field threshold alarm value which can be about 1,000 volts/meter and reference circuit 140 can be used to set the magnetic field threshold alarm value which can be about 1 Gauss. The magnetic field threshold alarm value for the RF field can depend upon the operating frequency and type of implanted electronic medical device. These or any other suitable values can be programmed into the digital potentiometer resistors 131, 132 in the reference circuits 130, 134, 140 for the portable monitoring device 100. As such, a designated exposure threshold level may be programmed into the device.

The sensor outputs are compared If the comparison of the preset alarm level A 121, with the time varying DC level from rectifier R 117, results in an alarm condition from one or more of the outputs from the sensor inputs 101, 102, 103, 104, or 105, the output from comparator CMP C 119, can latch and output an alarm signal. The alarm actuation can result in a flash signal to the LED L 123 and/or actuate an audible beeper B 124 or any other suitable alarm mechanism, to signal a potential high field condition to the wearer.

For example, in an embodiment the personal monitor can detect an electric field that has a value of 100 volts per meter or greater. When this condition is detected, the output from comparator CMP C 119, can latch and output an alarm signal can be transmitted to flash the LED L 123 and/or actuate an audible beeper B 124, to signal a high electric field condition to the wearer. The wearer can then move to a safer location that is not exposed to the hazardous fields.

The comparator 119 and timer circuitry T 118 can be configured to signal the high field condition alarm output until manually reset by the wearer by depressing reset switch R 26. In an embodiment the timer TMR T 118 may also a predetermined period of time has elapsed. For example, the timer circuitry T 118 can be configured to reset the personal monitor 110 after a nominal 2 hours (or any other preset duration) of time have elapsed. This timer and beeper features are can be especially useful in the case where the wearer is not able to speak or is incapacitated. This is the preferred embodiment and to those ordinarily skilled in the art of analog design, other forms of the inventive device can be visualized.

As such, the personal monitoring device 100 may provide personal monitoring of a three-axis magnetic field, electric field, and radio frequency field. The device may simultaneously monitor electric fields, radio frequency fields, and the magnetic fields along three mutually orthogonal axes. The device may compare the detected signal levels of the three fields to separate preset levels or threshold values and may notify a user or wearer of the device of a potentially hazardous or suprathreshold condition by a visual, audible, and/or physical (e.g., through a vibratory signal) alarm.

Figure 3:
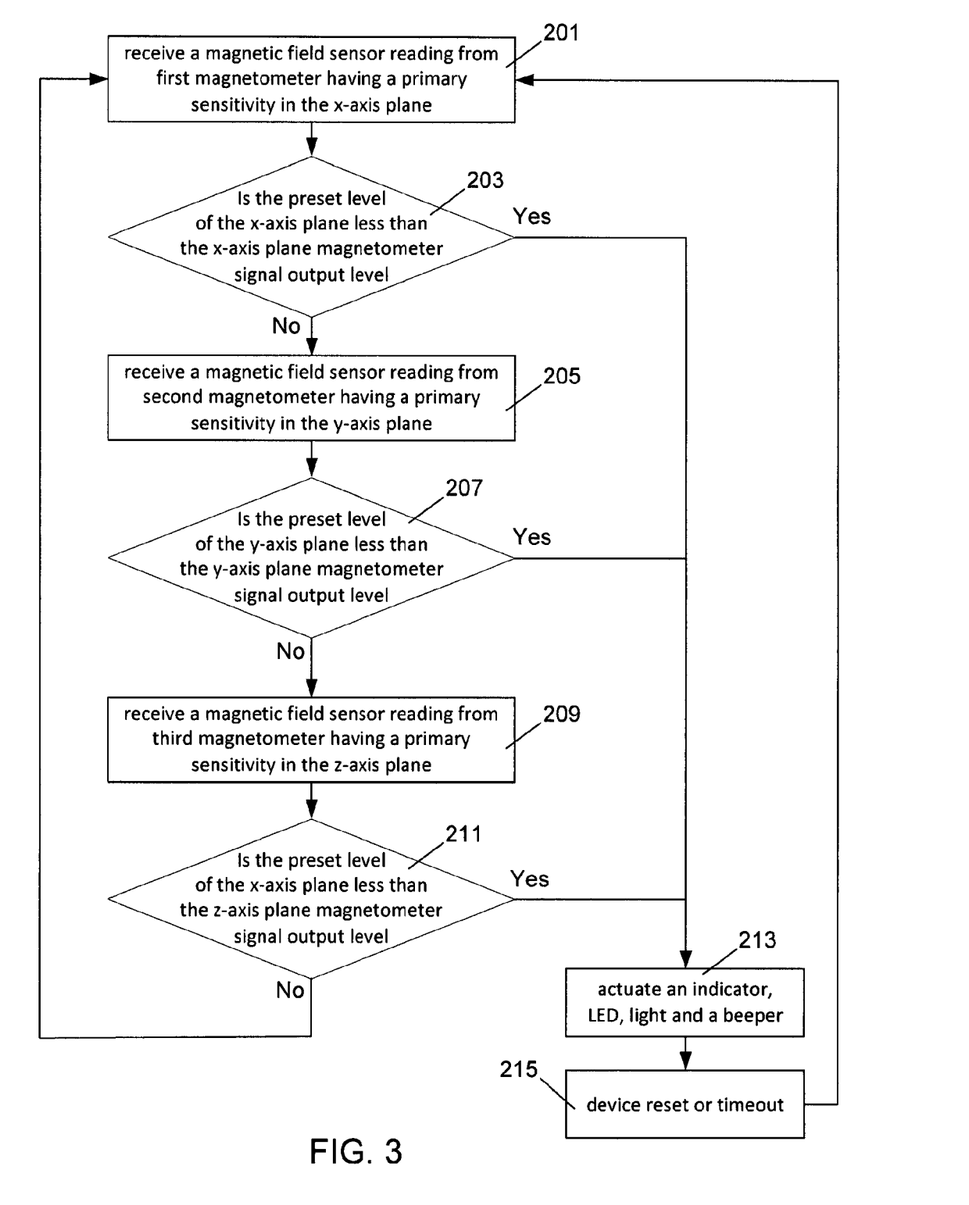
FIG. 3 is a flow chart for monitoring of the magnetic field sensors.

With reference to FIG. 3, a flow chart illustrating a method for monitoring the magnetic field sensors is illustrated. As discussed above, the personal monitoring device can include three magnetic field sensors that can be aligned with the x, y and z axis. In this embodiment the magnetic field sensors are monitored sequentially. The system can be switched to turn on the first magnetic field sensor having a primary sensitivity in the plane designated as the x-axis plane and obtain an output reading from the first magnetic field sensor 201. The system can then compare the detected x-axis magnetic field sensor output signal level to the x-axis plane preset alarm level. The comparator can determine if the preset alarm level of the magnetic field in the x-axis plane is less than the x-axis plane magnetometer signal output level 203. If the x-axis sensor signal output level is above the preset alarm level, the comparator can actuate an indicator, LED, light and/or a beeper to alert the wearer of the high magnetic field 213. If the personal monitoring device is reset or the timeout period expires 215, the system can restart monitoring the magnetic field sensors.

If the x-axis sensor signal output level is below the preset alarm level, the system can turn off the x-axis sensor and turn on the y-axis magnetometer and receiving a magnetic field sensor reading output from first the on board magnetometer having a primary sensitivity in the plane designated as the y-axis plane 205. The system can compare the y-axis sensor signal level to the y-axis plane preset alarm level 207. If the preset alarm level of the y-axis plane is less than the y-axis plane magnetometer signal output level, the system can actuate an indicator, LED, light and a beeper 213 and wait for the device to be reset or timeout 215 before restarting the monitoring. If the y-axis sensor is below the preset alarm level of the y-axis plane, the system can turn off the y-axis sensor and turn on the z-axis magnetometer. The system can receive a magnetic field sensor reading output from third the on board magnetometer having a primary sensitivity in the plane designated as the z-axis plane. The system can comparing the signal level to the z-axis plane preset alarm level 309. If the preset alarm level of the z-axis plane is less than the z-axis plane magnetometer signal output level the system can actuate an alarm indicator such as an LED, light and/or a beeper 213. The device to be reset or timeout 215 before restarting the monitoring. If the z-axis magnetometer signal output level is below the z-axis preset alarm level the system can turn off the z-axis sensor, turn on the x-axis sensor and restart the described magnetic field sensing process.

Figure 4:
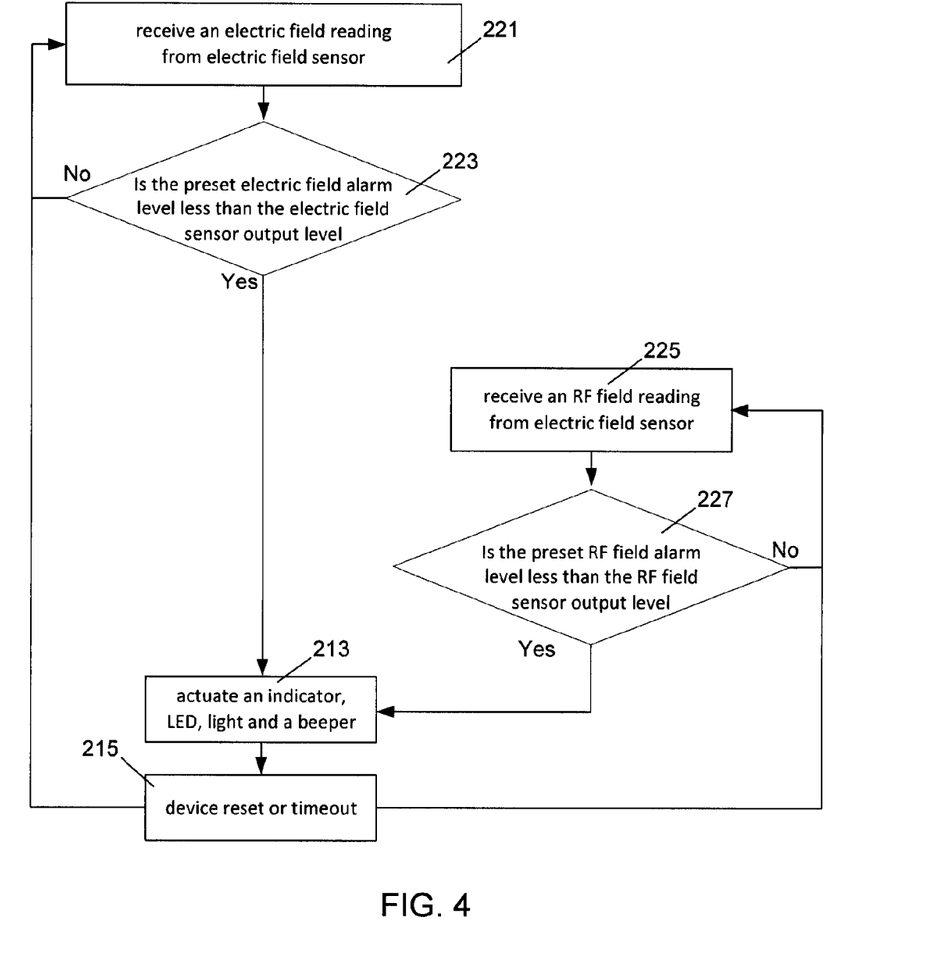
FIG. 4 is a flow chart for monitoring the electrical and RF field sensors.

The magnetic field sensing process described with reference to FIG. 3 can occur concurrently with and independently of additional ambient field monitoring. The system can also monitor the ambient electric field levels and the RF field levels as illustrated with reference to FIG. 4. The system can receive electric field sensor readings from the electric field sensor 221. The system can then compare the detected electric field level to the preset electric field alarm level 223. If the detected electric field readings are less than the predetermined electric field alarm level, the system can continue to receive and monitor the electric field readings from the electric field sensor 221. However, if the detected electric field level is greater than the preset electric field alarm level, the system can actuate the alarm indicator which can be an LED, light and/or beeper 213 and then wait for the system to be reset or time out 215 before resuming the electric field monitoring. The system can also receive RF field sensor readings from the RF field sensor 225. If the detected RF field sensor readings are less than the preset RF field alarm setting, the system can continue to monitor the RF field readings from the RF field sensor. If the RF field sensor readings are greater than the preset RF field alarm setting, the system can actuate the alarm 213 and wait for the system to be reset or time out 215 before resuming RF monitoring. The processes illustrated in FIGS. 3 and 4 can occur independently or concurrently.

As such, a personal monitoring device may implement a detection and alarm method. In some embodiments, a magnetic field sensor reading output or signal level from a first magnetometer that has a primary sensitive in a plane designated as the x-axis may be received. The signal level may be compared to a preset alarm level or threshold and if the signal level in the x-axis exceeds the preset alarm threshold, then an alarm or indication (e.g., light, beep, vibration, etc.) may be issued until the device is reset. However, if the signal level in the x-axis does not exceed the preset alarm threshold, then a y-axis magnetometer may be turned on and a magnetic field sensor reading output signal level from a magnetometer having a primary sensitivity in the y-axis may be received. In some embodiments, the y-axis signal component may be added in quadrature to the x-axis signal component and the sum of the y-axis and x-axis components may be compared to a second preset alarm level or threshold. If the sum of the x-axis and y-axis components is above the second preset alarm threshold, then an alarm may be issued as previously disclosed. However, if the sum of the x-axis and y-axis components does not exceed the second preset alarm threshold, then a z-axis magnetometer may be turned on and a magnetic field sensor reading output signal level from a magnetometer having a primary sensitivity in the z-axis may be received. In some embodiments, the z-axis signal component may be added in quadrature to the sum of the x-axis signal component and y-axis signal component and the sum of the x-axis, y-axis, and z-axis components may be compared to a third preset alarm level or threshold. If the sum of the x-axis, y-axis, and z-axis components is above the third preset alarm threshold, then an alarm may be issued as previously disclosed. However, if the sum of the x-axis, y-axis, and z-axis components does not exceed the third preset alarm threshold, then the method may continue to detect and receive the magnetic field signal levels.

Figure 5:
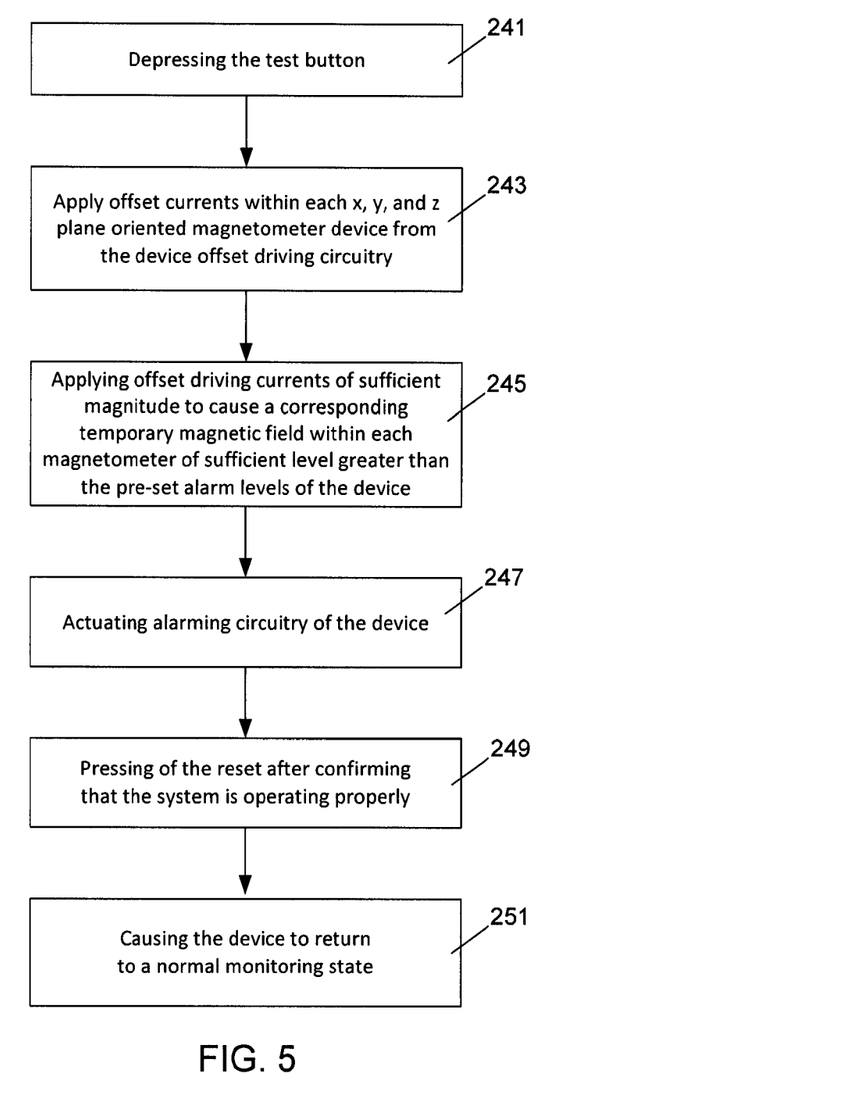
FIG. 5 is a flow chart for testing and resetting magnetic field sensors of the personal monitoring device.

With reference to FIG. 5, the system can have a test button that is actuated to perform a specific series of steps to test the functionality of the system 241. The system can initiate the testing process by applying offset currents within each of the x plane oriented magnetic field sensor, the y plane oriented magnetic field sensor, and z plane oriented magnetic field sensor 243. The offset driving currents can have a sufficient magnitude to cause a corresponding temporary magnetic fields within each of the magnetic field sensors to be greater than the pre-set alarm levels of each of the magnetic field sensors 245. The system can be monitoring one of the magnetic field sensors and the offset driving current can cause the system to detect a magnetic field in excess of the predetermined magnetic field alarm level and actuating an alarm circuit on the personal monitoring device 247. The operator can press the reset button after confirming that the system is operating properly based upon the reaction to the test 249. This resetting can cause the personal monitoring system to turn off the alarms and return to its normal monitoring state 251.

It will be understood that the inventive system has been described with reference to particular embodiments, however additions, deletions and changes could be made to these embodiments without departing from the scope of the inventive system. Although the systems that have been described include various components, it is well understood that these components and the described configuration can be modified and rearranged in various other configurations.

What is claimed is:

1. A personal monitoring device comprising:
   a first magnetic field sensor aligned with an X axis coupled to first magnetic field signal conditioning circuitry for processing a first output signal from the first magnetic field sensor to obtain a first conditioned output signal;
   a second magnetic field sensor aligned with a Y axis coupled to second magnetic field signal conditioning circuitry for processing a second output signal from the second magnetic field sensor to obtain a second conditioned output signal;
   a third magnetic field sensor aligned with a Z axis coupled to third magnetic field signal conditioning circuitry for processing a third output signal from the third magnetic field sensor to obtain a third conditioned output signal;
   a comparator circuit coupled to the first magnetic signal conditioning circuitry, the second magnetic signal conditioning circuitry and the third magnetic signal conditioning circuitry for comparing the first conditioned output signal, the second conditioned output signal and the third conditioned output signal to a threshold magnetic field signal value; and
   an alarm coupled to the comparator circuit that is actuated when the first conditioned output signal, the second conditioned output signal or the third conditioned output signal exceeds the threshold magnetic field signal value.

2. The personal monitor device of claim 1, further comprising:
   at least one electric field sensor; and
   electric field signal conditioning circuitry coupled to the at least one electric field sensor for processing a first output signal from the at least one electric field sensor to obtain a first conditioned electric field output signal.

3. The personal monitor device of claim 1, further comprising:
   at least one radio frequency field sensor; and
   radio frequency field signal conditioning circuitry coupled to the at least one radio frequency field sensor for processing a first output signal from the at least one radio frequency field sensor to obtain a first conditioned radio frequency field output signal.

4. The personal monitor device of claim 1, where the first magnetic field sensor, the second magnetic field sensor and the third magnetic field sensor are each oriented orthogonally to each other.

5. The personal monitor device of claim 1, such that the orientation of the first magnetic field sensor, the second magnetic field sensor and the third magnetic field sensor provides high sensitivity in the x, y and z planes in free space respectively.

6. A personal monitoring device comprising:
   a first magnetic field sensor aligned with an X axis outputting a first magnetic field sensor signal;
   a second magnetic field sensor aligned with a Y axis outputting a second magnetic field sensor signal;
   a third magnetic field sensor aligned with a Z axis outputting a third magnetic field sensor signal;
   a low frequency oscillator circuit for individually actuating each of the first magnetic field sensor, the second magnetic field sensor and the third magnetic field sensor;
   a comparator for comparing the first magnetic field sensor signal, the second magnetic field sensor signal and the third magnetic field sensor signal to a threshold magnetic field signal value, the comparing occurring at least two times each second; and
   an alarm coupled to the comparator circuit that is actuated when the first magnetic field sensor signal, the second magnetic field sensor signal or the third magnetic field sensor signal exceeds the threshold magnetic field signal value.

7. The personal monitor device of claim 6, wherein the first magnetic field sensor, the second magnetic field sensor and the third magnetic field sensor are low power MEMS magnetometer devices.

8. A personal monitoring device comprising:
   three magnetic field sensors, each magnetic field sensor being aligned with a single and different x, y and z axis, each magnetic field sensor being coupled to magnetic field signal conditioning circuitry for processing output signals from each of the magnetic field sensors to obtain conditioned magnetic field sensor output signals;
   an electric field sensor;
   a radio frequency (RF) field sensor;
   a processor coupled to the three magnetic field signal conditioning circuitry, the electric field sensor and the radio frequency field sensor, the processor comparing the conditioned magnetic field sensor output signals, an electric field sensor signal and a radio frequency field sensor signal to corresponding threshold values; and
   an alarm device that is actuated by the processor when one or more of the signals exceeds the corresponding threshold value.

9. The personal monitoring device of claim 8 wherein the processor compares an electric field sensor signal to a threshold electric field value and the alarm device is actuated by the processor when the electric electric field sensor signal exceeds 100 volts per meter.

10. The personal monitoring device of claim 8 wherein the processor compares a radio frequency field sensor signal to a threshold radio frequency field value and the alarm device is actuated by the processor when the radio frequency field sensor signal exceeds the preset radio frequency field alarm setting.

11. The personal monitoring device of claim 8 wherein the processor compares an electric field sensor signal to a threshold electric field value and the alarm device is actuated by the processor when the electric field reaches or exceeds 1,000 volts per meter.

12. The personal monitoring device of claim 8 further comprising:
  a low frequency oscillator circuit that transmits a reset pulse to magnetometers in the three magnetic field sensors to self calibrate and reset the magnetometers.

13. The personal monitoring device of claim 8 further comprising:
  a self-test mechanism that creates a magnetic field within the three magnetic field sensors oriented in x, y, and z plane, the magnetic field having sufficient strength to trigger the alarm device when a test button coupled to the self-test mechanism is actuated.

14. The personal monitoring device of claim 8 wherein the alarming device includes programmable components for storage of one or more of the alarm threshold values.

15. A method for detecting a hazardous environment using a personal monitoring device including an x-axis magnetometer, a y-axis magnetometer, a z-axis magnetometer, a radio frequency (RF) field sensor, an electric field sensor, an alarming device and a processor coupled to the x-axis magnetometer, the y-axis magnetometer, the z-axis magnetometer, the electric field sensor, the radio frequency field sensor, and the alarming device, the method comprising
  turning on the x-axis magnetometer;
  receiving by the processor, an x-axis magnetic field sensor reading from the x-axis magnetometer;
  comparing by the processor, the x-axis magnetic field sensor reading to an x-axis plane preset alarm level;
  determining by the processor, that the x-axis plane preset alarm level is greater than the x-axis magnetic field sensor reading;
  turning off the x-axis magnetometer;
  turning on the y-axis magnetometer;
  receiving by the processor, a y-axis magnetic field sensor reading from the y-axis magnetometer; and
  comparing by the processor, the y-axis magnetic field sensor reading to a y-axis plane preset alarm level.

16. The method of claim 15 further comprising:
  determining by the processor, that the y-axis plane preset alarm level is less than the y-axis magnetic field sensor reading; and
  actuating by the processor, the alarming device.

17. The method of claim 15 further comprising:
  determining that the y-axis plane preset alarm level is greater than the y-axis magnetic field sensor reading;
  turning off the y-axis magnetometer;
  turning on the z-axis magnetometer;
  receiving by the processor, a z-axis magnetic field sensor reading from the z-axis magnetometer; and
  comparing by the processor, the z-axis magnetic field sensor reading to a z-axis plane preset alarm level.

18. The method of claim 17 further comprising:
  determining by the processor, that the z-axis plane preset alarm level is less than the z-axis magnetic field sensor reading; and
  actuating by the processor, the alarming device.

19. The method of claim 17 further comprising:
  determining by the processor, that the z-axis plane preset alarm level is greater than the z-axis magnetic field sensor reading;
  turning off the z-axis magnetometer.

20. The method of claim 17 further comprising:
  receiving by the processor, a radio frequency field sensor reading from the radio frequency sensor;
  comparing by the processor, the radio frequency field sensor reading to a radio frequency field preset alarm level;
  determining by the processor, that the radio frequency field preset alarm level is less than the radio frequency field sensor reading; and
  actuating the alarming device.

21. The method of claim 17 further comprising:
  receiving by the processor, a radio frequency field sensor reading from the radio frequency field sensor;
  comparing by the processor, the radio frequency field sensor reading to a radio frequency field preset alarm level;
  determining by the processor, that the radio frequency field preset alarm level is less than the radio frequency field sensor reading; and
  actuating by the processor, the alarming device.

22. The method of claim 15 further comprising:
  turning on the x-axis magnetometer;
  actuating a test button coupled to offset driving circuitry;
  applying offset currents within each of the x-axis magnetometer, the y-axis magnetometer, the z-axis magnetometer from the offset driving circuitry;
  generating temporary magnetic fields within each of the x-axis magnetometer, the y-axis magnetometer, and the z-axis magnetometer greater than pre-set alarm levels of each of the x-axis magnetometer, the y-axis magnetometer, and the z-axis magnetometer;
  comparing by the processor, the x-axis magnetic field sensor reading to an x-axis plane preset alarm level;
  determining by the processor, that the x-axis plane preset alarm level is less than the x-axis magnetic field sensor reading; and
  actuating by the processor, the alarming device.

23. The method of claim 22 further comprising:
  actuating a reset button coupled to the processor;
  turning the alarming device off; and
  returning the personal monitoring device to a normal monitoring state.

\* \* \* \* \*